(12) United States Patent
Cheng et al.

(10) Patent No.: US 7,692,424 B2
(45) Date of Patent: Apr. 6, 2010

(54) METHOD OF AND SOFTWARE APPLICATION FOR QUANTIFYING OBJECTS IN MAGNETIC RESONANCE IMAGES VIA MULTIPLE COMPLEX SUMMATIONS

(75) Inventors: Yu-Chung Norman Cheng, Northville Township, MI (US); Ching-Yi Hsieh, Detroit, MI (US); E. Mark Haacke, Grosse Pointe Farms, MI (US)

(73) Assignee: Magnetic Resonance Innovations, Inc., Detroit, MI (US)

( * ) Notice: Subject to any disclaimer, the term of this patent is extended or adjusted under 35 U.S.C. 154(b) by 73 days.

(21) Appl. No.: 12/039,548

(22) Filed: Feb. 28, 2008

(65) Prior Publication Data

US 2009/0219023 A1 Sep. 3, 2009

(51) Int. Cl.
  *G01V 3/00* (2006.01)
(52) U.S. Cl. ..................... 324/307; 324/309
(58) Field of Classification Search ......... 324/300–322; 600/407–445
  See application file for complete search history.

(56) References Cited

U.S. PATENT DOCUMENTS

| | | | | |
|---|---|---|---|---|
| 4,720,679 | A * | 1/1988 | Patrick et al. | 324/309 |
| 6,477,398 | B1 * | 11/2002 | Mills | 600/409 |
| 6,501,272 | B1 * | 12/2002 | Haacke et al. | 324/306 |
| 6,658,280 | B1 * | 12/2003 | Haacke | 600/410 |
| 6,856,134 | B1 * | 2/2005 | Pelc et al. | 324/309 |
| 7,382,129 | B2 * | 6/2008 | Mills | 324/318 |
| 7,545,967 | B1 * | 6/2009 | Prince et al. | 382/130 |
| 7,573,265 | B2 * | 8/2009 | Haacke | 324/306 |
| 2007/0253910 | A1 * | 11/2007 | Ahrens et al. | 424/9.34 |

OTHER PUBLICATIONS

Cheng et al., "A Complex Sum Method of Quantifying Susceptibilities in Cylindrical Objects: The First Step Toward Quantitative Diagnosis of Small Objects in MRI", Magnetic Resonance Imaging - ScienceDirect, Oct. 2007, pp. 1171-1180, vol. 25, Elsevier Inc.

Sedlacik et al., "Obtaining Blood Oxygenation Levels from MR Signal Behavior in the Presence of Single Venous Vessels", Magnetic Resonance in Medicine, Oct. 29, 2007, pp. 1035-1044, vol. 58, 2007 Wiley-Liss, Inc.

(Continued)

*Primary Examiner*—Briji B Shrivastav
(74) *Attorney, Agent, or Firm*—Thompson Coburn LLP; Clyde L. Smith, Esq.

(57) ABSTRACT

A method comprises digitally representing a volume of space as a plurality of voxels and assigning real and imaginary values derived from magnetic resonance imaging data of the space to each of the voxels. Furthermore, the method comprises a steps of calculating a first complex summation of the real and imaginary values of a first set of the voxels, and calculating a second complex summation of the real and imaginary values of a second set of the voxels. Each set of voxels represents a different region of the volume of space. The regions are concentric. The method also comprises steps of using the first and second summations, along with another value quantitatively calculated from the magnetic resonance imaging data, to calculate a value that is dependent upon the approximate magnetic moment of an object within the volume of space, and digitally representing and storing said value.

28 Claims, 5 Drawing Sheets

OTHER PUBLICATIONS

Cheng et al., "Quantifying Magnetic Moment, Susceptibility, or Volume of an Isolated Small Object from Magnetic Resonance Images", Powerpoint Presentation - American Association of Medical Physics, Jul. 22, 2008 and Jul. 30, 2009, pp. 1-18.

Hsieh et al., "A Novel Approach of Quantifying Susceptibilities in Small Objects: Quantitative Diagnosis in MRI", Proceedings of the International Society for Magnetic Resonance in Medicines, 2006, p. 1836, vol. 14.

Hsieh et al., "An Improved Approach of Quantifying Magnetic Moments of Small in-vivo Objects", Proceedings of the International Society for Magnetic Resonance in Medicines, May 2007, p. 2596 vol. 15.

Cheng et al., "Methods of Quantifying Susceptibilities in Gel Phantoms", Proceedings of the International Society for Magnetic Resonance in Medicines, 2004, p. 1719, vol. 11.

Hsieh et al., "A Novel Simulated Method of Quantifying Susceptibilities in Objects: The First Step Toward Quantitative Diagnosis in MRI", Abstract SU-FF-I-28 Medical Physics, Jun. 2005, p. 1910, vol. 32, No. 6.

Hsieh et al., "Qualifying Magnetic Moments in Small Cylindrical Objects by Complex Sum Method", Medical Physics, Jun. 2007 (published in Jul. 2007) p. 2358, vol. 34, No. 6.

Hsieh et al., "A Quantitative Approach of Extracting Magnetic Moments in Small Cylindrical Object", Proceedings of the International Society for Magnetic Resonance in Medicine, 2008, p. 3076.

Hsieh et al., "Quantifying Magnetic Moments of Small Spherical Objects in MRI Images", Medical Physics, 2008 (accepted as a talk in Jul. 2008), p. 2906, vol. 35, No. 6.

Hsieh et al., "Quantifying Magnetic Moments and Susceptibilities of Small Spherical Objects in MRI", Medical Physics, 2009 (accepted as a talk in Jul. 2009), p. 2816, vol. 36, No. 6.

\* cited by examiner

METHOD OF AND SOFTWARE APPLICATION FOR QUANTIFYING OBJECTS IN MAGNETIC RESONANCE IMAGES VIA MULTIPLE COMPLEX SUMMATIONS

CROSS-REFERENCE TO RELATED APPLICATIONS

None.

STATEMENT REGARDING FEDERALLY SPONSORED RESEARCH OR DEVELOPMENT

Not Applicable.

APPENDIX

Not Applicable.

BACKGROUND OF THE INVENTION

1. Field of the Invention

This invention relates generally to magnetic resonance imaging (MRI). More particularly, this invention pertains to a method of quantifying objects, including sub-voxel objects, in magnetic resonance images using multiple complex summations to solve for unknown characteristics of the objects.

2. Related Art

Brain and blood vessel MRI studies generate a need for the quantification of objects of interest, including sub-voxel objects. Such quantification is useful for imaging microbleeds, measuring calcium deposits, and specifically for molecular imaging where iron plays the role of a key biomarker of disease. Due to a limited signal-to-noise ratio, imaging duration, or electronic constraints, the spatial resolution in MRI at any given field strength is limited to a finite voxel size that may be larger or just slightly smaller than an object. Thus, the source of the signal can be just a few voxels or less than one voxel in size, making it very difficult to quantify the relative magnetic moment, susceptibility, or the exact volume of such objects.

SUMMARY OF THE INVENTION

An object of the invention is to quantify the relative magnetic moment, susceptibility, or the exact volume of objects using a systematic approach, as opposed to a curve-fitting approach.

In a first aspect of the invention, a method comprises obtaining magnetic resonance imaging data for a volume of space and digitally representing the volume of space as a plurality of voxels. Additionally, the method comprises as step of assigning real and imaginary values derived from the magnetic resonance imaging data to each of the voxels. Furthermore, the method comprises a steps of calculating a first complex summation of the real and imaginary values of a first set of the voxels, calculating a second complex summation of the real and imaginary values of a second set of the voxels. The first subset of the voxels represents a first region of the volume of space. The second subset of the voxels represents a second region of the volume of space. The second region is concentric to the first region, and the third region is concentric to the first and second regions. Still further, the method comprises steps of using the first and second complex summations in combination with another value quantitatively calculated from the magnetic resonance imaging data to calculate a value that is dependent upon the magnetic moment of an object within the volume of space. The method also includes a step of digitally representing and storing the value that is dependent upon the magnetic moment of the object.

In another aspect of the invention, a method comprises a step of scanning a portion of a person's body using magnetic resonance imaging. The magnetic resonance imaging generates magnetic resonance imaging data corresponding to the portion of the person. The method also comprises a step of calculating at least two complex summations of different portions of the magnetic resonance imaging data. Additionally, the method comprises steps of using each of the two complex summations in combination with another value quantitatively calculated from the magnetic resonance imaging data to calculate a value dependent upon the magnetic moment of an object within the portion of the person's body, and storing the value dependent upon the magnetic moment of the object in a file associated with the patient.

Yet another aspect of the invention pertains to software for determining a characteristic of an object from magnetic resonance imaging data obtained via a magnetic resonance imaging scan of the object. The characteristic is dependent upon the magnetic moment, volume, or magnetic susceptibility of the object. The software comprises computer executable instructions configured to obtain real and imaginary values from the magnetic resonance imaging data for each of a plurality of voxels. Additionally, the software comprises computer executable instructions configured to calculate a first complex summation of the real and imaginary values of a first set of the plurality of voxels, and computer executable instructions configured to calculate a second complex summation of the real and imaginary values of a second set of the plurality of voxels. The second set of the plurality of voxels is a subset of the first set of the plurality of voxels. Still further, the software comprises computer executable instructions configured to estimate the characteristic in a manner such that the characteristic is dependent upon the first complex summation, the second complex summation, and another value quantitatively calculated from the magnetic resonance imaging data.

Further features and advantages of the present invention, as well as the operation of various embodiments of the present invention, are described in detail below with reference to the accompanying drawings.

DETAILED DESCRIPTION OF THE PREFERRED EMBODIMENTS

The small objects in magnetic resonance imaging that are quantifiable using the invention include air bubbles, agglomerations of ferritin, hemosiderin, calcium, or other metal or mineral matter in the brain or other parts of the body. Human tissue, being mainly water, provides a diamagnetic background. Additionally, the small objects may include nanoparticle-based magnetic contrast agents introduced for purposes of molecular imaging or as drug treatments. The magnetic susceptibility of a contrast agent is proportional to its concentration, and therefore quantifying local susceptibility provides a measure of agent or drug efficiency. Aside from the healthcare industry, the small objects may also include air bubbles or metallic particles trapped on filters in industrial fluid systems. Furthermore, the invention can also be applied to large objects, provided that there is a sufficient amount of tissue or material surrounding such objects.

In accordance with fundamental electromagnetism principles, the magnetic properties of small objects can be investigated by treating the small objects as long narrow cylindrical objects, which can be done using a two-dimensional approach in accordance with the invention, or as spheres, which can be done using a three-dimensional approach in accordance with the invention.

In many circumstances, the small objects of interest do not have proton spins and do not produce measurable MRI signals themselves. However, the local magnetic field information induced by their magnetic susceptibilities is distributed in their neighboring voxels. Using the present invention, the relative magnetic susceptibility or magnetic moment between an object and its neighboring voxels, whose diameter can be less than five voxels, can be extracted from a given set of complex anatomical MRI data, as an inverse problem. This is done using a summation of complex MRI signals around an object of interest in a manner reducing the number of unknowns, which thereby allows one to solve for the relative magnetic moment, susceptibility, and/or the volume of the object.

Representing Objects as Long Narrow Cylinders

By treating a small object as if it were a long narrow cylinder, the methods of the present invention can be applied via a two-dimensional approach. More specifically, the method can be applied to a slice of image voxels that is one voxel thick.

Figure 1:
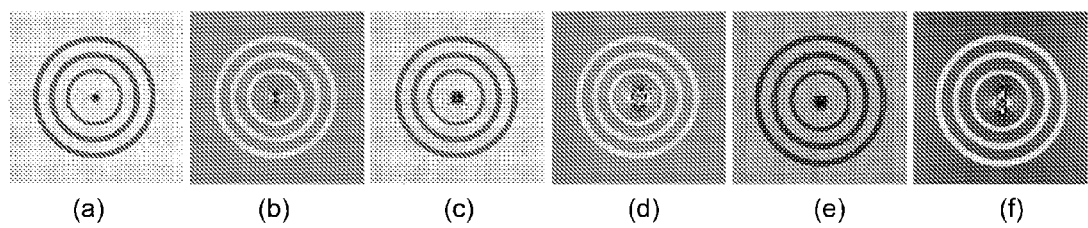
FIG. 1 illustrates several magnetic resonance magnitude images and several magnetic resonance phase images of small objects, each of which is shown with three rings representing the three regions used to obtain the complex summations.

FIG. 1 shows cross sections of three sets of magnetic resonance images used herein to describe a two-dimensional approach of applying method in accordance with the present invention. Each of the magnetic resonance images is of either a long air cylinder or a long cylinder filled with diluted nanoparticles in gel phantoms. The actual radii of all cylinders are 0.8 mm, and each is longer than 64 mm. The in-plane resolution of each image is 1 mm×1 mm. The main magnetic field strength was 1.5 T and was applied along the left-right direction for each image and perpendicular to the cylinder. FIGS. 1(a) and 1(b) show the magnitude and associated phase images (respectively) of an air cylinder in a gel phantom at echo time 5 ms. FIGS. 1(c) and 1(d) show the magnitude and associated phase images (respectively) of the air cylinder in the gel phantom at echo time 20 ms. FIGS. 1(e) and 1(f) show the magnitude and associated phase images (respectively) of a cylinder filled with magnetic nanoparticles in a gel phantom at echo time 5 ms. All images were acquired from a gradient echo sequence in MRI. Although all the cylinders actually have identical radii, the cylinders (shown as dark portion of the magnitude images) appear to have different diameters in the magnitude images. The cylinders create dipolar phase aliasing patterns in phase images.

Figure 2A:
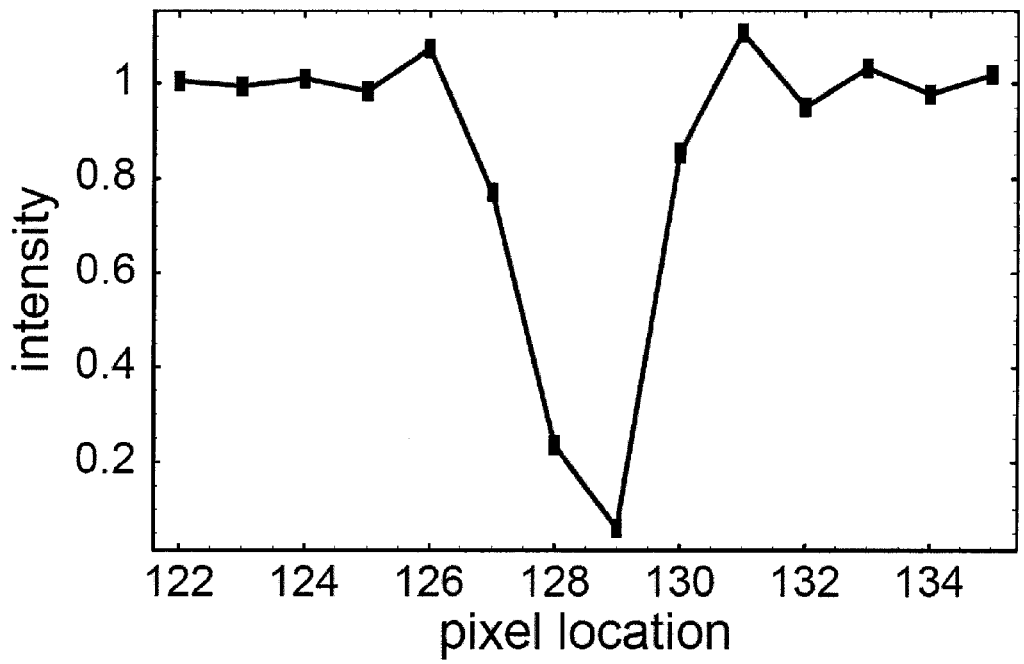
FIG. 2 illustrates results obtained using the invention in connection with an infinitely long cylindrical object having a radius 0.8 voxel, simulated without the thermal noise.
Figure 2B:
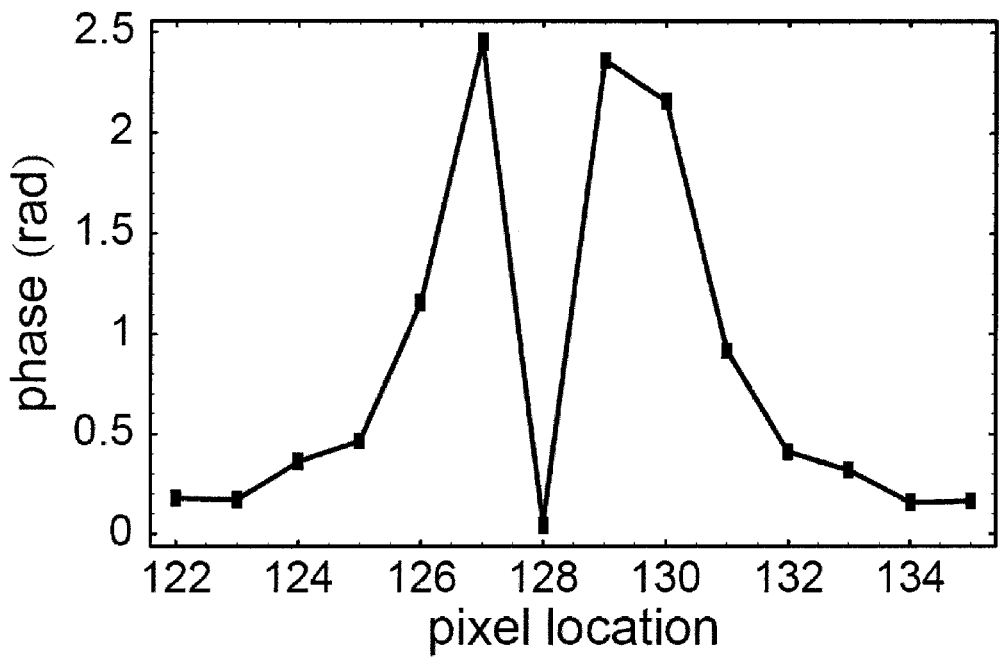
Figure 2C:
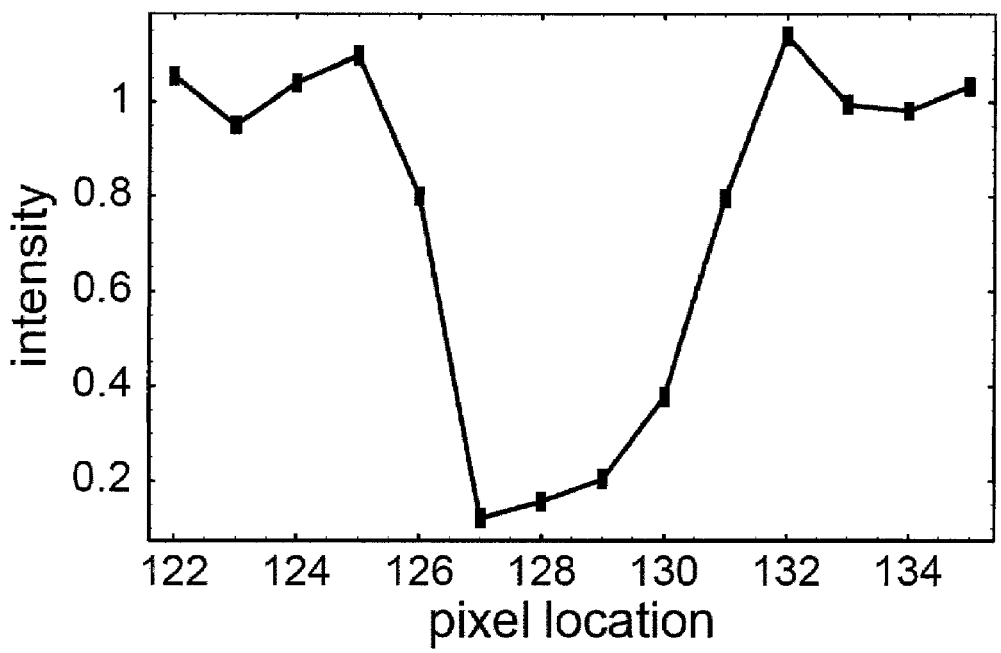
Figure 2D:
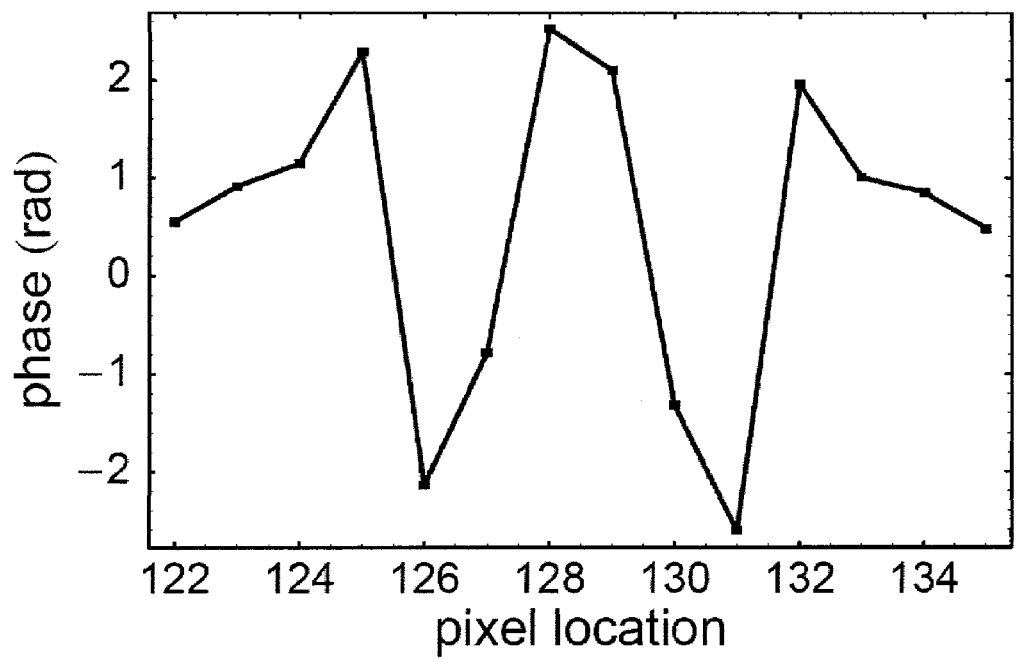

The phase of MRI phase image outside an infinitely long cylinder is given by Equation (1), as follows:

$$\phi = -\gamma \Delta B T_E = -\gamma \frac{\Delta \chi}{2} \frac{a^2}{\rho^2} B_0 T_E \cos 2\psi \equiv -g \frac{a^2}{\rho^2} \cos 2\psi \equiv -\frac{p}{\rho^2} \cos 2\psi \quad (1)$$

where $\gamma$ is the gyromagnetic ratio (a constant, $2\pi \cdot 42.58$ MHz/T for protons), $\Delta \chi$ is the magnetic susceptibility difference between the susceptibility inside and outside the cylinder, $a$ is the object (cylinder) radius, $\rho$ is the perpendicular distance from the axis of the cylinder, $B_0$ is the main field of the MRI system, $T_E$ is the echo time (an input parameter in MRI scans), and $\psi$ is the angle measured from the main field. Parameters g and p are self-defined in Eq. 1 and represent maximum (or minimum) phase value and effective magnetic moment, respectively. Although the sign in all phase images of FIG. 1 (resulting from MRI manufacturing conventions) is opposite to the sign in Eq. 1, Eq. 1 accurately represents the phase aliasing effect seen in FIG. 2(d). $\Delta \chi$ and $a$ are the two unknowns to be quantified from MR images. For purposes of describing the invention, $\Delta \chi$ is referred to herein as simply "magnetic susceptibility" or "susceptibility." The phrase "magnetic moment" is referred to p. The SI unit of volume magnetic susceptibility is dimensionless, and is often given in ppm.

From a set of magnitude and phase images shown in FIG. 1, the overall MRI signal S within a given circle with radius R concentrically of the object is given by Equation (2), as follows:

$$S = \sum_j M_j e^{i\phi_j} = \quad (2)$$

$$\pi R^2 l \rho_0 \lambda \int_\lambda^1 dz J_0 (0.5 \gamma z \Delta_\chi B_0 T_E)/z^2 = \pi l \rho_0 p \int_{p/R^2}^g dx J_0(x)/x^2$$

where $M_j$ is the magnitude MRI signal in each voxel labeled with index j and $\phi_j$ is its associated phase value. Additionally, l is the image slice thickness, $\rho_0$ is the effective spin density (which includes imaging and tissue parameters such as $T_1$ and $T_2$), $\lambda = a^2/R^2$, and $J_0$ is the zeroth order Bessel function. In order to improve the accuracy of the method and add only the relevant portion of MRI signal within the given circle, each voxel is divided into 100 (or a significant amount of) sub-voxels. Each sub-voxel is assigned one percent (or the inverse of the number of sub-voxels per voxel) of the original MRI signal of its respective parent voxel. In deriving Eq. 2, $\rho_0$ is assumed to be a constant with a given set of imaging and tissue parameters and it is assumed that the cylindrical object itself does not produce an MRI signal. In general, $\rho_0$ varies in space. For example, if the surrounding tissue of a microbleed contains only one tissue, then $\rho_0$ is a constant in the neighborhood of the microbleed.

It should be appreciated that if $T_E$ in Eq. 2 is increased, due to the decay nature of the zeroth order Bessel function $J_0$, the overall signal S will decrease. This is referred to as the "dephasing effect" in MRI terminology. For this reason, one cannot simply zoom MR images to determine the size of an unknown object unless the susceptibility effect is negligible (i.e., $\Delta \chi \approx 0$). As shown in magnitude images of FIG. 1, the low signal areas depict object of different sizes. In reality, the images are of objects of identical size (0.8 mm in radius).

Eq. 2 shows that the overall MRI signal S happens to be a real number. This is used to determine the center (i.e., the axis) of the cylindrical object. To do this, a circle with radius R which encompasses the object is repositioned about the apparent center of object and the overall complex summation signal S is calculated at each position. When the imaginary part of S is minimized, the center of the cylinder is identified. The size of the circle used impacts the accuracy of the center determination. If too small, the thermal noise and discrete voxels adds significant uncertainty into the process. If too large, the overall MRI signal is dominated by the voxels lacking magnetic moment information and the method can not accurately identify the object center. Through experimentation, it has been determined that, based on the phase images, a circle whose circumference intersects with phase values at roughly ±2 radians along the vertical and horizontal axes works sufficiently well. With a proper choice of $T_E$, this generally results in a radius of at least 3 voxels. The center of the object identified by this procedure is typically off by no more than 0.3 voxel from the true center and, in some cases, is off by no more than 0.1 voxel.

As shown in FIG. 1, using three arbitrary concentric circles with radii $R_1$, $R_2$, and $R_3$, the corresponding signals $S_1$, $S_2$, and $S_3$ can be calculated from MR images. As such, Eq. 2 can be re-written as follows:

$$(S_1 - S_2) \int_{p/R_1^2}^{p/R_3^2} dx J_0(x)/x^2 = (S_1 - S_3) \int_{p/R_1^2}^{p/R_2^2} dx J_0(x)/x^2 \quad (3)$$

where the effective magnetic moment, p, becomes the only unknown in the equation. It should be appreciated that, although both ±p satisfy Eq. 3, the correct sign of p can be determined from MR phase images using Eq. 1. From Eq. 1, it is clear that $p/R_i^2$ is the maximum (or minimum) phase value at the circumference of the i-th circle. As such, if any $R_i$ is chosen to be larger than the phase aliasing area, then $|p/R_i^2|$ will be always less than $\pi$ and the solution of p can be numerically searched between 0 and $\pi R_{min}^2$ using a Van Wijngaarden-Dekker-Brent method, where $R_{min}$ is the smallest radius among three circles $R_i$. The initial guess of value p can be estimated by expanding $J_0$ in power series. The choice of all $R_i$ larger than the phase aliasing region (i.e., $|p/R_i^2|<\pi$) ensures that a unique solution of p can be obtained from Eq. 3. It should be appreciated that p is not simply solved from the product of a phase value from MR phase images and a single $R_i$ because it is a discrete problem and we often choose $R_i$ to be a non-integer real number. For example, $R_1$ and $R_2$ can be 2.3 and 2.6 voxels, respectively. In such a case, both radii map to the same phase value. However, as $S_i$ can change with even a slight change of $R_i$, Eq. 3 provides a more accurate means of solving for the magnetic moment.

The discrete voxels in magnetic resonance images lead to differences between the complex summation signal $S_i$ and its theoretical prediction. For purposes of this description, such differences are referred to herein as systematic noise. If the object size and susceptibility are known, the magnetic resonance images can be simulated and the systematic uncertainty of that simulation can be determined. Thermal noise in magnetic resonance images due to the presence of an object can be simulated by adding a Gaussian noise distribution in the MRI complex data. These two noise sources lead to the uncertainty of p, which can be estimated using an error propagation method, derived from the partial derivatives of p and $S_i$ in Eq. 3. Using the error propagation method and with the signal-to-noise ratio 10:1 as well as a proper choice of $T_E$, using typical MRI techniques, the uncertainty of p can be minimized to less than 5%, by selecting $R_i$ in a manner such that the $p/R_i^2$ values are roughly 0.1, 1, and 3 radians in the phase images. This can be verified by the simulations and gel phantom studies shown in images (c) and (d) of FIG. 1.

As shown in FIG. 2, when the phase value of 3 radians cannot be found, the uncertainty of p increases to 10%, which can be confirmed via both the error propagation method and phantom studies. FIG. 2 illustrates results of an infinitely long cylindrical object having a radius 0.8 voxel simulated without the thermal noise. In the simulation, the main magnetic field is 1.5T and the susceptibility difference between the cylinder inside and outside is 9.4 ppm. Additionally, the center of the object is purposely shifted to the 128.9th voxel. Using the methods of the invention, the center of the object can be identified within 0.1 voxel from the simulated center. The magnitude profile shown in FIG. 2(a) and its associated phase profile shown in FIG. 2(b), are simulated with an echo time of 5 ms. The magnitude profile shown in FIG. 2(c) and its associated phase profile shown in FIG. 2(d), are simulated with a $T_E$ of 20 ms. As shown in FIG. 2, the asymmetric phase patterns, (b) and (d), and asymmetric dephasing profiles, (a) and (c), are apparent. These profiles match closely with the profiles obtained from real gel phantom data. It should be appreciated that each voxel contains only one complex signal, displayed as dots in these plots, and the lines connecting dots have no particular meaning.

It should be appreciated that if a cylindrical object is not perpendicular to the main field of the MRI machine, then a factor $\sin^2\phi$ should be multiplied in Eq. 1 and be added in the argument of the $J_0$ function in Eqs. 2 and 3, where $\phi$ is the angle between the axis of the cylinder and the main field direction. The angle $\phi$ can be determined by using the coordinates of the end points of the cylindrical object in images. Thus, the approaches described above are applicable to a cylinder with any orientation except when $\phi=0$, i.e., when the cylindrical object is parallel to the main field of the MRI system. When $\phi=0$, with Eq. 2, two circles around the object will be sufficient to identify the radius of the object. (See further discussion under Section "Objects Having Spin Density.")

Representing Objects as Spheres

By treating a small object as if it were sphere, the methods of the present invention can be applied via a three-dimensional approach.

The preferred method of applying the invention to a spherical object begins with the MRI phase distribution outside a sphere with radius a, as follows:

$$\phi = -\gamma \Delta B T_E = -\gamma \frac{\Delta\chi}{3} \frac{a^3}{r^3}(3\cos^2\theta - 1)B_0 T_E \equiv -g'\frac{a^3}{r^3}(3\cos^2\theta - 1) \quad (4)$$

where $\Delta\chi$ is the magnetic susceptibility difference between the susceptibility inside and outside a spherical object. Angle $\theta$ is between the main field axis and the direction of the observer. The parameter |g'| is self-defined in Eq. 4 and is the maximum phase value (with $\theta=\pi/2$) in the three-dimensional case. The effective magnetic moment p' is defined as $g'a^3$. The parameters g' and p' in the three-dimensional case are the counterparts of g and p in the two-dimensional case.

The total theoretical complex signal S due to a spherical object within a concentric sphere of radius R is as follows:

$$S = \frac{4\pi}{3}\rho_0 R^3 (1-\lambda) \int_{-1}^{2} dx \tilde{P}(x) e^{i\gamma(\Delta\chi)B_0 T_E x/3} = \quad (5)$$

$$\frac{4\pi}{3}\rho_0 R^3 (1-\lambda) \int_{-1}^{2} dx \tilde{P}(x) e^{-ig'x}$$

where $\lambda \equiv (a/R)^3$ is the volume fraction in the three-dimensional case and $\tilde{P}(x)$ is the density-of-states, as follows:

$$\tilde{P}(x) = \frac{\lambda}{3\sqrt{3}(1-\lambda)x^2}(2-x)\sqrt{1+x} \quad \text{when } x \in (-1, -\lambda) \text{ or } (2\lambda, 2) \quad (6)$$

$$= \frac{\lambda}{3\sqrt{3}(1-\lambda)x^2}\left[(2-x)\sqrt{1+x} - \left(2-\frac{x}{\lambda}\right)\sqrt{1+\frac{x}{\lambda}}\right] \quad \text{when } x \in (-\lambda, 2\lambda)$$

$$= 0 \quad \text{otherwise}$$

where $\rho_0$ is the effective spin density outside the spherical object, which itself does not have a spin density.

The use of Eq. 5 in actual magnetic resonance images comprises the summation of the overall MRI complex signal within radius R by dividing each voxel into 1000 sub-voxels. The complex signal of a spherical shell between two spheres with radii $R_1$ and $R_2$ is as follows:

$$\frac{9\sqrt{3}}{4\pi\rho_0}(S_1 - S_2) = R_1^3 \int_1^{R_1^3/R_2^3} \frac{dx}{x^2}\left(2e^{ip'x/R_1^3} + e^{-2ip'x/R_1^3}\right) + \quad (7)$$

$$\int_{-1}^{2} \frac{dx}{x^2}[2 - (2-x)\sqrt{1+x}]\left(R_1^3 e^{-ixp'/R_1^3} - R_2^3 e^{ixp'/R_2^3}\right)$$

Similar to the two-dimensional method, the solution of p' is unique if both $R_i$ are chosen large enough such that each $|ixp'/R_i^3|$ is less than $\pi$. The magnetic moment p' can be solved by calculating the ratio of the real part to the imaginary part of $S_1-S_2$. However, the series expansion of $\exp(p'/R_i^3)$ reveals that no first order of $p'/R_i^3$ remains in Eq. 7 and the leading term of the imaginary part is on the order of $(p'/R_i^3)^3$. Via simulations, it has been determined that the imaginary part of Eq. 7 is not sensitive to the presence of noise. Thus, alternatively, p' can be solved using a third concentric sphere by calculating the ratio of the real part of $S_1-S_2$ to the real part of $S_1-S_3$. The phase value decreases quickly as the third power of distance in the spherical case (see Eq. 4) and with a proper choice of $T_E$ the differences between one $R_i$ and the next is within one or two voxels. However, using only the real part of the complex summation to solve the magnetic moment does not allow for the determination of the sign of p'. Nonetheless, the imaginary part of the complex summation can be used to the correct sign of p'. It should be appreciated that the sign of p' distinguishes the object between paramagnetic and diamagnetic (relative to water). Similar to the two-dimensional case, the uncertainty of p' can be studied through the error propagation method, simulations, and phantom studies. Using the error propagation method and with the signal-to-noise ratio 10:1 as well as a proper choice of $T_E$, the uncertainty of p' can be minimized to approximately 5%, by selecting $R_i$ in a manner such that the $p'/R_i^3$ values are roughly 0.1, 1, and 3 radians in the phase images.

From Eq. 4, the overall MRI phase around the spherical object within a concentric sphere is zero. Due to the discrete nature of voxels in images, utilizing the summation of phase values or imaginary parts leads to an incorrect center of the object, which is at least half a voxel away from the true center of the object. However, by maximizing the shell signal ($|S_1 - S_2|$), the center of the spherical object can be accurately determined to within 0.3 voxel from the true center of the object. Alternatively, by minimizing the overall signal S shown in Eq. 5, the center of the spherical object can be accurately determined to within 0.3 voxel of the true center of the object.

The optimization method of identifying the center of the spherical object can be examined through further analysis. Although the first and second partial derivatives of the spherical shell signal with respect to object location can be analytically derived, additional insight can be gained through examination of the shell signal, within radii $R_1$ and $R_2$ via the following equation:

$$S_1 - S_2 = 2\pi\rho_0 \int_{R_2}^{R_1} drr^2 \int_0^{\pi} d\theta \cos\theta e^{i\phi} \quad (8)$$

where $\phi$, is given by Eq. 4 but with r in Eq. 4 replaced by $x \equiv \sqrt{r^2 + r_0^2 - 2rr_0\cos(\theta-\theta_0)}$, and $\cos\theta$ in Eq. 4 replaced by $(r\cos\theta - r_0\cos\theta_0)/x$, where $r_0$ is the distance between the center of the shell and the center of the spherical object, and $r_0 \cos\theta_0$ is the z coordinate of the spherical object. Similar to the two-dimensional application, it should be appreciated that the intent here is to derive an equation that is affected only by the position of the object but not the unknowns.

Determining the Susceptibility and Volume of the Object

There are at least two approaches for determining the susceptibility and volume of the object. A first approach is discussed immediately below and is based on a gradient echo sequence in MRI, preferably with multiple echo times. A second approach is described in further along in this description and is based on a spin echo sequence in MRI with only one echo time.

The effective magnetic moment p or p' contains the product of the susceptibility and volume of the object. Whether the susceptibility ($\Delta\chi$) and volume can be individually resolved depends on the choice of $T_E$ in a gradient echo sequence in MRI, particularly when noise exists in the MR images. Although the following descriptions are for the two-dimensional case, it should be appreciated that the general concept can be applied to the three-dimensional case. As the moment p is proportional to $T_E$, the magnetic moment at any echo time $T_E$ can be scaled by a known p at a particular $T_E$. With a known magnetic moment p, the effective spin density $\rho_0$ can be determined from Eq. 2 with two concentric circles of radii $R_1$ and $R_2$. A third circle with radius $R_3$ can then be used in Eq. 2 to determine the only remaining unknown g, which is proportional to $\Delta\chi T_E$. Each of radii $R_i$ can be chosen independently of the radii previously used to determine the magnetic moment.

FIG. 3 shows the impact of echo time on the signal. For simplicity, no noise has been added. FIG. 3(a) shows a plot of the integral in Eq. 2 as a function of g with a=1 mm, $\rho_0$l=1, and R=3 mm. The MRI signal S is represented by a horizontal line and is calculated with g=9. The intersections of the straight line and the curve represent possible solutions of g. FIG. 3(b) is similar to FIG. 3(a) except that the echo time is reduced such that $\rho_0$l=0.9 and the MRI signal is calculated with g=0.7. In this case the maximum (or minimum) phase value g can be uniquely determined. FIG. 3(c) depicts normalized signals based on Eq. 2 as a function of echo time. The solid curve is plotted with the volume fraction 0.1 and susceptibility 0.95 ppm. The curve comprised of short dashes and the curve comprising longer dashes are simulated with volume fraction 0.02 and 0.17, and susceptibility 4.75 and 0.57 ppm, respectively, such that the product of the volume fraction and susceptibility is identical in all three curves. FIG. 3(d) is similar to FIG. 3(c), but the solid curve is simulated with volume fraction 0.3 and susceptibility 0.95 ppm and the curve comprised of short dashes and the curve comprising longer dashes are simulated with volume fraction 0.1 and 0.43, and susceptibility 2.85 and 0.67 ppm, respectively. FIGS. 3(c) and (d) demonstrate that, if noise had been included in simulations, the volume fraction and susceptibility could each only be roughly determined at an order of magnitude through curve fitting.

Figure 3A:
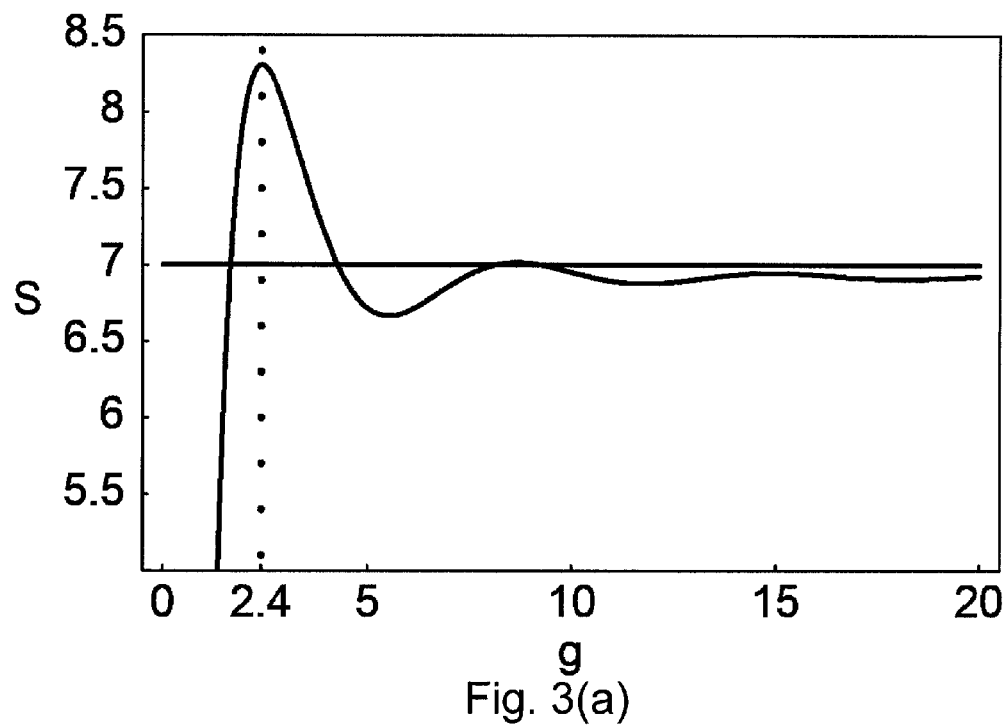
FIG. 3 illustrates the impact of echo time on a magnetic resonance image signal.
Figure 3B:
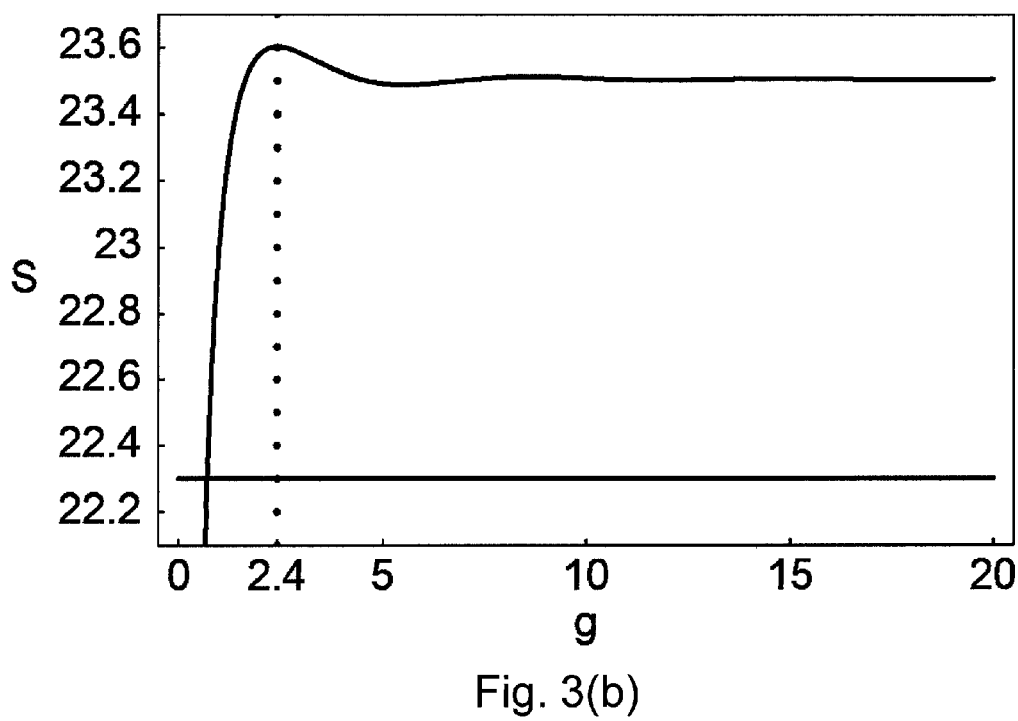
Figure 3C:
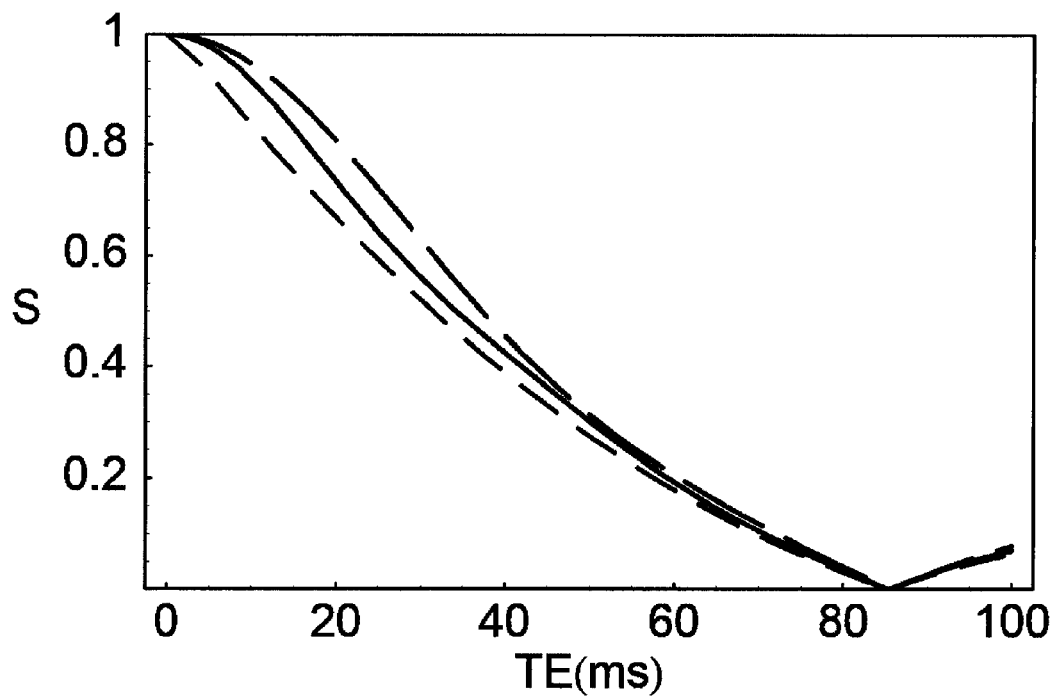
Figure 3D:
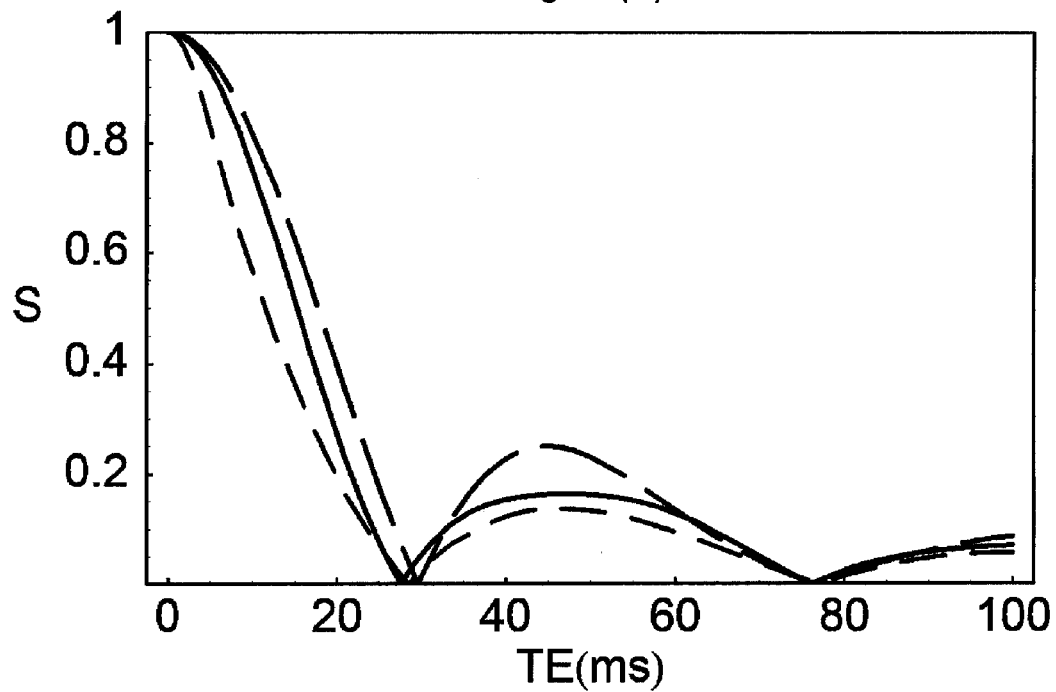

It should be appreciated that, as FIG. 3(a) demonstrates, if the echo time is too long, then we cannot determine |g| uniquely but we can determine a minimum value of |g|. This is because the integral in Eq. 2 oscillates and approaches an asymptotic value as |g| increases (with a fixed p). As shown in FIG. 3(b), the echo time has to be shorter than a particular value for g to be solved uniquely from Eq. 2. When |g|<2.4, which is the first root of the $J_0(x)$ function, and if $R_3$ is sufficiently large such that $|p/R_3^2|<2.4$ (p being known), then the integral in Eq. 2 becomes a monotonic function of |g| up to 2.4. With the presence of noise in images, when |g|>2.4, only the minimum value of susceptibility $|\Delta\chi|$ and maximum value of cylinder radius a are likely determinable. From Eq. 1, if $|\Delta\chi|$ is 1 ppm in SI units (which is roughly twice the value used for veins in the functional MRI studies) and $B_0$=1.5T, $T_E$ needs to be less than 12 ms for |g| to be less than 2.4. If $R_3$ is sufficiently large, then |g|, and therefore $\Delta\chi$, can be uniquely determined. An echo time $T_E$ of 12 ms is often used in MRI scans. The scans shown in FIG. 1 (a-d) involved a susceptibility difference of 9.4 ppm, which requires an echo time of less than 1.3 ms to resolve the cylinder radius.

Even with a reduction of the echo time in a gradient echo sequence, the susceptibility and the volume of an object can each be meaningfully determined only if the volume of the object is larger than a certain fraction of a voxel. This fraction is determined by the signal-to-noise ratio in the images and is explained below for the two-dimensional approach. If the echo time is reduced such that it is close to zero in a gradient echo sequence, then $J_0$ function in Eq. 2 can be approximated as unity and Eq. 2 can be simplified as follows:

$$S_{SE}=\rho_0 l\pi R^2(1-a^2/R^2)=\rho_0 l\pi R^2(1-\lambda) \quad (9)$$

If the object is presumed to be smaller than one voxel, in order to quantify the volume of the object, the differences between an MRI signal with the object and one without the object has to be larger than the thermal noise per voxel. Based on Eq. 9, this means that the volume fraction has to be larger than the inverse of the signal-to-noise ratio. In addition, the higher the signal-to-noise ratio, the more accurate the quantification of the volume becomes. The uncertainty can be easily determined by applying the error propagation method on Eq. 9.

As mentioned above, the second approach for determining the susceptibility and volume of the object is based on a spin echo sequence in MRI with only one echo time. The situation in which $T_E$=0 in a gradient echo sequence represents the images acquired from a spin echo sequence. With sufficiently high signal-to-noise ratio in the spin echo images, the actual volume of a sub-voxel object can be determined from Eq. 9 via two arbitrary geometries that each encloses the object. Although in such a case the imaging parameters of the spin echo sequence do not need to be identical to those of the gradient echo sequence, a set of high resolution spin echo images is preferred. If an object has the same susceptibility as that of its surrounding tissue, then the spin echo image will show the correct volume of the object (provided that the spin density of the object is quite different from the spin density of the surrounding tissue). On the other hand, a nanoparticle can cause a void in the signal of spin echo image and in such case, the low signal region may not represent the true volume of the nanoparticle.

It should be appreciated that the presence of the susceptibility of the object can lead to distortion artifacts in images. In addition, susceptibility of the object can cause signal loss during data sampling even in the spin echo sequence. This also happens using gradient echo sequences but the dephasing effect through the echo time dominates the effect. The distortion artifacts can generally be minimized by increasing the read bandwidth in a sequence. However, such a change will lead to a reduction in the signal-to-noise ratio of the images.

It should also be appreciated that the approaches described above can also be applied to the three-dimensional spherical case with reasonable modifications based on Eqs. 4-7. Moreover, a spin echo sequence is routinely performed in a typical clinical diagnosis. Thus, in some cases, one gradient echo sequence could be used to determine the magnetic moment of the object and one spin echo sequence could be used to determine the volume of the object, without requiring registration of the images or an extra sequence in a clinical examine.

Objects Having Spin Density

When an object of interest (such as a blood vessel) has a spin density (i.e., MRI signal), a complex number and a real number must be added to Eq. 2 (when using a two-dimensional approach) and Eq. 5 (when using a three-dimensional approach), respectively. In the latter situation, it should be appreciated that the phase value is zero inside a spherical object. Using the two-dimensional approach, the center of the cylindrical object can be determined by minimizing the imaginary part of the MRI signal within an annular ring (i.e., 1 mg. $S_1-S_2$=0) or similar approaches described above for the three-dimensional case. Alternatively, the Fourier shift theorem can be used to identify the center of the cylinder (as described by Jan Sedlacik et al. in Magnetic Resonance in Medicine 58:1035-1044 (2007)). Even if the object has a spin density, Eqs. 3 and 7 remain unchanged for solving the magnetic moment p and p'.

Individually resolving the susceptibility and volume of the object in this case can be more challenging, as the spin density of the object also varies with the echo time. Using the two-dimensional approach, when the cylindrical object is perpendicular to the main field, the overall MRI signal within a circle with radius R is as follows:

$$S = \pi l \rho_0 p \int_{p/R^2}^{g} dx J_0(x)/x^2 + \pi l a^2 \rho_{0,c} e^{ig/3} \quad (10)$$

where $\rho_{0,c}$ is the spin density of the cylindrical object and is a function of $T_E$. The imaginary part of this signal is purely from the object itself, $\pi l a^2 \rho_{0,c} \sin(g/3)$. Thus, a multiple echo gradient echo scan can be preformed such that one of the $T_E$S will lead to the maximum or minimum of the imaginary part of Eq. 10. At the maximum (or minimum), the value of $g/3$ will be around $\pi/2+2n\pi$ (or $-\pi/2+2n\pi$) where n is an arbitrary integer. The real part of Eq. 10 is used as a consistency check to verify that $\pi l a^2 \rho_{0,c} \cos(g/3)$ is zero (within uncertainty). Alternatively, both $\pi l a^2 \rho_{0,c}$ and $g/3$ can be solved from Eq. 10 as the first term in Eq. 10 is almost a constant when $|g| \geq 3\pi/2$ and p is known. Nonetheless, this latter method is less favorable, as quantitative analysis involving the imaginary part or the phase may lead to a large uncertainty. With the three circle approach discussed above, p and $\rho_0$ can be determined at a given $T_E$. Because $a^2 = p/g$, the susceptibility and object volume can be determined uniquely if the rough value of $\rho_{0,c}$ (which is most likely on the same order of magnitude of $\rho_0$) is known. However, it should be appreciated that this procedure will fail if the cylindrical object is at the magic angle (i.e., ~55°) against the main field, as no field would exist inside the object and therefore the imaginary part in Eq. 10 vanishes.

When a cylindrical object is at the magic angle, an alternative approach of determining the susceptibility and volume of the cylindrical object is to acquire the signal from a the spin echo sequence, as follows:

$$S_{SE} = \rho_0 l A(1-\lambda) + \pi l a^2 \rho_{0,c} = \rho_0 l A - \rho_0 l \pi a^2 + \pi l a^2 \rho_{0,c}$$

where A is the area of any geometry that encloses the object. If the signal-to-noise ratio in the spin echo image is sufficiently high, using two such geometries, $\rho_0$ in Eq. 11 from the spin echo sequence can be determined and the term $\pi l a^2 \rho_{0,c}$ in Eq. 11 can be expressed by the measured spin echo signal and the unknown object volume. Furthermore, if the imaging parameters used in a gradient echo sequence and the spin echo sequence are about the same such that the $T_2$ decay of the object can be neglected, $\pi l a^2 \rho_{0,c}$ in Eq. 11 is roughly the MRI signal of the object from the gradient echo sequence and the following equation can be applied:

$$S = \pi l \rho_0 p \int_{p/R^2}^{g} dx J_0(x)/x^2 + \pi l a^2 \rho_{0,c} \quad (12)$$

Since the magnetic moment p can be determined at a given echo time of a gradient echo image, the volume of the object is essentially $\pi p l/g$. As such, g becomes the only unknown in Eq. 12 and g can be determined. However, it should be appreciated that in some cases, only the minimum value of $|g|$ will be determinable using this approach. The concept of this approach can also be extended to the three-dimensional case.

When a cylindrical object is parallel to the main field, Eq. 10 becomes:

$$S = \rho_0 l \pi R^2 - \rho_0 l \pi a^2 + \pi l a^2 \rho_{0,c} e^{-2ig/3}$$

In this special case, the above multiple echo time approach described of solving Eq. 10 can be applied here in order to solve g from an echo time that leads to the maximum or minimum signal in the imaginary part. Similarly, with two concentric contours, $\rho_0$ and $a^2$ can be determined easily, provided enough signal-to-noise ratio in the gradient echo images. Lastly, as a consistency check, the contribution of the real part from the last term in Eq. 13 should be close to zero or the echo time should be adjusted. It should be appreciated in this case that the exact g will not be determinable unless the range of the object susceptibility is known in advance.

In view of the foregoing, it should be appreciated that the complex summation method of the present invention simultaneously overcomes three common problems associated with estimating magnetic moment or magnetic susceptibility, namely, the partial volume effect, the dephasing effect in the magnitude image, and the phase aliasing effect in the phase image. Moreover, it should be appreciated that, in general, a gradient echo sequence with one echo time is sufficient for the complex summation method to determine the effective magnetic moment of the object. The complex summation method relies on existing imaging parameters, but does not require any other a priori information.

The invention facilitates the evaluation and monitoring of microbleeds (defined as objects whose MRI signal and susceptibility are different from the MRI signal and susceptibility of their surrounding environment or tissue) over time since more accurate magnetic moment and/or volume approximation of such objects can be obtained using the method. Additionally, localized nanoparticle concentrations can be quantified using the invention, assuming the magnetic moment or volume of such object can be determined. Still further, the invention can be used to evaluate the effectiveness of drug treatments, assuming the drug uses a targeted contrast agent that contains iron or some other substance that causes major signal changes that are visible in magnetic resonance images.

In view of the foregoing, it should be appreciated that the invention achieves the several advantages over prior art methods and MRI systems.

As various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by any of the above-described exemplary embodiments, but should be defined only in accordance with the following claims appended hereto and their equivalents.

For example, if the intensity of a set of magnetic resonance images is uniform across a wide region, it should be appreciated that a volume of arbitrary geometry can be used to determine the effective spin density ($\rho_0$) of the neighboring tissue of the object of interest. After determining the effective spin density, all the procedures described above regarding quantifying the effective magnetic moment may require only two circles or two spheres in the two-dimensional and three-dimensional approach, respectively. Other procedures described above may require one less circle or sphere in the two-dimensional and three-dimensional approach, respectively.

It should also be understood that when introducing elements of the present invention in the claims or in the above description of the preferred embodiment of the invention, the terms "comprising," "including," and "having" are intended to be open-ended and mean that there may be additional elements other than the listed elements. Additionally, the term "portion" should be construed as meaning some or all of the item or element that it qualifies. Moreover, use of identifiers such as first, second, and third should not be construed in a manner imposing any relative position or time sequence between limitations. Still further, the order in which the steps of any method claim that follows are presented should not be construed in a manner limiting the order in which such steps must be performed.

What is claimed is:

1. Software for determining a characteristic of an object from magnetic resonance imaging data obtained via a magnetic resonance imaging scan of the object, the characteristic being dependent on at least one of magnetic moment, volume, and magnetic susceptibility, the software comprising:
   computer executable instructions configured to obtain real and imaginary values from the magnetic resonance imaging data for each of a plurality of voxels;
   computer executable instructions configured to calculate a first complex summation of the real and imaginary values of a first set of the plurality of voxels;
   computer executable instructions configured to calculate a second complex summation of the real and imaginary values of a second set of the plurality of voxels, the second set of the plurality of voxels being a subset of the first set of the plurality of voxels;
   computer executable instructions configured to estimate the characteristic in a manner such that the characteristic is dependent upon the first complex summation, the second complex summation, and another value quantitatively calculated from the magnetic resonance imaging data.

2. Software in accordance with claim 1 further comprising computer executable instructions configured to calculate the other value via a third complex summation of the real and imaginary values of a third set of the plurality of voxels.

3. Software in accordance with claim 1 further comprising computer executable instructions configured to estimate the volume and the magnetic susceptibility of the object.

4. Software in accordance with claim 1 wherein each of the plurality of voxels is a sub-voxel of one of a plurality of larger voxels and the step of obtaining real and imaginary values from the magnetic resonance imaging data for each of the plurality of sub-voxels comprises a step of obtaining real and imaginary values from the magnetic resonance imaging data for each of the larger voxels.

5. Software in accordance with claim 4 wherein the object has a center location that is positioned within one of the sub-voxels, the software further comprising computer executable instructions configured to calculate an approximation of the center location of the object to within one of the sub-voxels.

6. Software in accordance with claim 1 wherein the object has a center location and the software further comprises computer executable instructions that are configured to calculate an approximation of the center location by performing the steps of:
   calculating a first real summation of the real values of all of the voxels that are within a given radius from a first possible location;
   calculating a second real summation of the real values of all of the voxels that are within the given radius from a second possible location;
   determining which of the first and second real summations is greater than the other;
   setting the approximation of the center location equal to the first possible location when the first real summation is greater than the second real summation; and
   setting the approximation of the center location equal to the second possible location when the second real summation is greater than the first real summation.

7. Software in accordance with claim 1 wherein the object has a center location and the software further comprises computer executable instructions that are configured to calculate an approximation of the center location by performing the steps of:
   calculating a first imaginary summation of the imaginary values of all of the voxels that are within a given radius from a first possible location;
   calculating a second imaginary summation of the imaginary values of all of the voxels that are within the given radius from a second possible location;
   determining which of the first and second imaginary summations is less than the other;
   setting the approximation of the center location equal to the first possible location when the first imaginary summation is less than the second imaginary summation; and
   setting the approximation of the center location equal to the second possible location when the second imaginary summation is less than the first imaginary summation.

8. Software in accordance with claim 1 wherein the object has a center location that is positioned within one of the voxels, the software further comprising computer executable instructions configured to calculate an approximation of the center location of the object, the first set of the plurality of voxels lie within and fill a first spatial region that is symmetric about the approximation of the center location, the second set of the plurality of voxels lie within and fill a second spatial region, and the first and second spatial regions are concentric.

9. Software in accordance with claim 8 wherein each of the first and second spatial regions is spherical in shape.

10. Software in accordance with claim 8 wherein the each of the first and second spatial regions is discoidal in shape.

11. Software in accordance with claim 8 further comprising computer executable instructions configured to calculate the other value via a third complex summation of the real and imaginary values of a third set of the plurality of voxels, the third set of the plurality of voxels lie within and fill a third spatial region, and the first and third spatial regions are concentric.

12. A method comprising:
   scanning a portion of a person's body using magnetic resonance imaging, the magnetic resonance imaging generating magnetic resonance imaging data corresponding to the portion of the person;
   calculating at least two complex summations of different portions of the magnetic resonance imaging data;
   using each of the two complex summations in combination with another value quantitatively calculated from the magnetic resonance imaging data to calculate a value dependent upon the magnetic moment of an object within the portion of the person's body;
   storing the value that is dependent upon the magnetic moment of the object in a file associated with the patient.

13. A method in accordance with claim 12 wherein the different portions of the magnetic resonance imaging data correspond to concentric regions of space.

14. A method in accordance with claim 12 wherein the object has a center location and the method further comprises a step of approximating the center location.

15. A method in accordance with claim 14 wherein the different portions of the magnetic resonance imaging data correspond to concentric regions of space that are each centered about the approximation of the center location of the object.

16. A method in accordance with claim 12 further comprising using each of the two complex summations to approximate the magnetic susceptibility of the object.

17. A method in accordance with claim 12 further comprising using the value that is dependent upon the magnetic moment of the object to track the progression of at least one of a vascular, a neurovascular, or a neuro-degenerate disease.

18. A method in accordance with claim 12 further comprising calculating at least a third complex summation of another different portion of the magnetic resonance imaging data, and using the third complex summation to calculate the other value quantitatively calculated from the magnetic resonance imaging data.

19. A method comprising:
   obtaining magnetic resonance imaging data for a volume of space;
   digitally representing the volume of space as a plurality of voxels;
   assigning real and imaginary values derived from the magnetic resonance imaging data to each of the voxels;
   calculating a first complex summation of the real and imaginary values of a first set of the voxels, the first set of the voxels representing a first region of the volume of space;
   calculating a second complex summation of the real and imaginary values of a second set of the voxels, the second set of the voxels representing a second region of the volume of space, the second region being concentric to the first region;
   using the first and second complex summations in combination with another value quantitatively calculated from the magnetic resonance imaging data to calculate a value that is dependent upon the magnetic moment of an object within the volume of space;
   digitally representing and storing the value that is dependent upon the magnetic moment of the object.

20. A computer containing a program that is adapted and configured to perform the method of claim 19.

21. A method in accordance with claim 19 further comprising steps of:
   using the first and second complex summations to calculate an approximation of the magnetic susceptibility of the object; and
   digitally representing and storing the approximation of the magnetic susceptibility of the object.

22. A method in accordance with claim 19 further comprising a step of calculating an approximate center location of the object, and wherein the first and second regions are centered about the approximate center location.

23. A method in accordance with claim 19 wherein the first and second regions each represent a sphere within the volume of space.

24. A method in accordance with claim 19 the first and second regions each represent a disk within the volume of space.

25. A method in accordance with claim 19 wherein the other value quantitatively calculated from magnetic resonance imaging data is calculated via a magnitude summation.

26. A method in accordance with claim 19 further comprising using the value that is dependent upon the magnetic moment of the object to estimate an amount of magnetic nanoparticles in at least a portion of the volume of space.

27. A method in accordance with claim 19 further comprising using the value that is dependent upon the magnetic moment of the object to estimate an amount of air bubbles in at least a portion of the volume of space.

28. A method in accordance with claim 19 further comprising using the value that is dependent upon the magnetic moment of the object to estimate an amount of foreign metallic particles in at least a portion of a filter.

\* \* \* \* \*